(12) United States Patent
Kawakami

(10) Patent No.: US 12,336,117 B2
(45) Date of Patent: Jun. 17, 2025

(54) LAMINATE, BONDING METHOD, AND INTERMEDIATE PRODUCT FOR CIRCUIT BOARD

(71) Applicant: NHK Spring Co., Ltd., Yokohama (JP)

(72) Inventor: Takeshi Kawakami, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 225 days.

(21) Appl. No.: 17/786,173

(22) PCT Filed: Dec. 17, 2020

(86) PCT No.: PCT/JP2020/047123
§ 371 (c)(1),
(2) Date: Jun. 16, 2022

(87) PCT Pub. No.: WO2021/125258
PCT Pub. Date: Jun. 24, 2021

(65) Prior Publication Data
US 2023/0018333 A1     Jan. 19, 2023

(30) Foreign Application Priority Data

Dec. 17, 2019   (JP) ................. 2019-227762

(51) Int. Cl.
*H05K 3/38*     (2006.01)
*H05K 1/05*     (2006.01)

(52) U.S. Cl.
CPC ............ *H05K 3/386* (2013.01); *H05K 1/056* (2013.01); *H05K 2201/0209* (2013.01); *H05K 2201/0263* (2013.01)

(58) Field of Classification Search
CPC ...... H05K 3/386; H05K 1/056; H05K 3/4635; H05K 2203/0143; H05K 2203/0522; H05K 1/0373
See application file for complete search history.

(56) References Cited

U.S. PATENT DOCUMENTS

| 5,652,055 | A | 7/1997 | King et al. |
| 6,254,972 | B1 | 7/2001 | Farquhar et al. |

(Continued)

FOREIGN PATENT DOCUMENTS

| CN | 105453707 A | 3/2016 |
| EP | 0331429 A2 | 9/1989 |

(Continued)

OTHER PUBLICATIONS

Notice of Reasons for Refusal dated Jul. 12, 2021, issued for the corresponding Taiwan application No. 109144767 and English translation thereof.

(Continued)

*Primary Examiner* — Jeremy C Norris
(74) *Attorney, Agent, or Firm* — Troutman Pepper Locke LLP; James E. Armstrong, IV; Nicholas J. DiCeglie, Jr.

(57) ABSTRACT

A laminate includes: a base material; a circuit; an insulating layer provided between the base material and the circuit, the insulating layer including a thermally conductive filler; and an adhesive configured to bond at least the base material and the insulating layer. The base material and the insulating layer are bonded by the adhesive in part and in contact with each other in other parts. A plurality of spaces are formed in the insulating layer, and the adhesive fills at least a portion of the plurality of spaces.

8 Claims, 3 Drawing Sheets

(56) References Cited

U.S. PATENT DOCUMENTS

| | | | |
|---|---|---|---|
| 2006/0160373 A1* | 7/2006 | Kowalski | H05K 3/4667 |
| | | | 257/E21.244 |
| 2011/0272720 A1 | 11/2011 | Gardner et al. | |
| 2012/0067631 A1 | 3/2012 | Kusukawa et al. | |
| 2016/0227644 A1 | 8/2016 | Hirotsuru et al. | |

FOREIGN PATENT DOCUMENTS

| | | | |
|---|---|---|---|
| EP | 1531661 A1 | 5/2005 | |
| JP | H06-081154 A | 3/1994 | |
| JP | 2009-246079 A | 10/2009 | |
| JP | 2010-186789 A | 8/2010 | |
| JP | 2013-254921 A | 12/2013 | |
| TW | 201203621 A | 1/2012 | |
| TW | 201422141 A | 6/2014 | |
| TW | I633813 B | 8/2018 | |
| WO | WO8000294 A1 * | 2/1980 | H05K 3/426 |
| WO | WO 2018043683 A1 * | 3/2018 | H05K 3/38 |

OTHER PUBLICATIONS

International Search Report mailed Mar. 16, 2021, issued for PCT/JP2020/047123 and English translation thereof.

Chinese Office Action dated Aug. 25, 2023, issued in the corresponding Chinese patent application No. 202080087347.8 and English translation of Cover Page & Search Report.

Office Action dated Mar. 28, 2023, issued for Chinese Patent Applicaton No. 202080087347.8 and English translation of Cover Page & Search Report.

Supplementary European Search Report dated May 16, 2023, issued for European Patent Application No. 20901716.9.

* cited by examiner

LAMINATE, BONDING METHOD, AND INTERMEDIATE PRODUCT FOR CIRCUIT BOARD

FIELD

The present invention relates to a laminate formed by laminating a circuit to a base material through an insulating layer, a bonding method, and an intermediate product for a circuit board.

BACKGROUND

A laminate formed by laminating a circuit to a base material through an insulating layer has conventionally been used as a substrate on which an integrated circuit or the like is mounted (see, for example, Patent Literatures 1 and 2). The insulating layer is responsible for ensuring a withstand voltage between the base material and the circuit. The insulating layer contains filler, which ensures thermal conductivity of the insulating layer. By using such a laminate, heat that is generated in heating elements on the circuit and is transferred to the circuit is transferred to the base material through the insulating layer, and the heat is dissipated from the base material to the outside. In Patent Literature 1, the insulating layer is bonded to the base material by pressure bonding. In contrast, in Patent Literature 2, an adhesive layer made of an adhesive is formed between the insulating layer and the base material to bond the insulating layer and the base material more firmly.

CITATION LIST

Patent Literature

Patent Literature 1: Japanese Patent Application Laid-open No. 2009-246079
Patent Literature 2: Japanese Patent Application Laid-open No. 2013-254921

SUMMARY

Technical Problem

The laminate must ensure the above-mentioned withstand voltage and heat dissipation characteristics (thermal conductivity) and must not delaminate between the base material and the insulating layer or between the insulating layer and the circuit. However, forming an adhesive layer as in the case of Patent Literature 2 lowers thermal conductivity.

The present invention has been made in view of the above, and it is an object of the present invention to provide a laminate, a bonding method, and an intermediate product for a circuit board that are capable of simultaneously satisfying withstand voltage, thermal conductivity, and bonding strength.

Solution to Problem

To solve the above-described problem, and achieve the object, a laminate according to the present invention includes: a base material; a circuit; an insulating layer provided between the base material and the circuit, the insulating layer including a thermally conductive filler; and an adhesive configured to bond at least the base material and the insulating layer, wherein the base material and the insulating layer are bonded by the adhesive in part and in contact with each other in other parts, the insulating layer includes a plurality of spaces formed therein, and the adhesive fills at least a portion of the plurality of spaces.

Moreover, in the above-described laminate according to the present invention, the adhesive is configured to bond the circuit and the insulating layer, and the circuit and the insulating layer are bonded by the adhesive in part and in contact with each other in other parts.

Moreover, in the above-described laminate according to the present invention, the insulating layer includes 60% to 85% of the filler by volume.

Moreover, a laminate according to the present invention includes: a base material; a circuit; an insulating layer provided between the base material and the circuit, the insulating layer including an insulating filler; and an adhesive configured to bond at least the circuit and the insulating layer, wherein the circuit and the insulating layer are bonded by the adhesive in part and in contact with each other in other parts, the insulating layer includes a plurality of spaces formed therein, and the adhesive fills at least a portion of the plurality of spaces that lead to a surface on a side of the circuit.

Moreover, a bonding method according to the present invention for a laminate including: a base material; a circuit; an insulating layer provided between the base material and the circuit, the insulating layer including an insulating filler; and an adhesive configured to bond at least the base material and the insulating layer, includes: permeating liquid adhesive into at least a portion of spaces formed in the insulating layer by applying the liquid adhesive to a bonding surface of the insulating layer to which the base material is bonded; and stacking the bonding surface of the insulating layer and a bonding surface of the base material, and curing the liquid adhesive by pressurizing at a high temperature.

Moreover, an intermediate product according to the present invention for a circuit board, includes: an insulating layer; and an adhesive, wherein the insulating layer includes a plurality of spaces formed therein, and the adhesive fills at least a portion of the plurality of spaces.

Advantageous Effects of Invention

According to the present invention, the laminate has the effect of being capable of simultaneously satisfying withstand voltage, thermal conductivity, and bonding strength.

DESCRIPTION OF EMBODIMENTS

Embodiments of the present invention will be described in detail below with reference to the drawings. The present invention is not limited by the following embodiments. Figures referred to in the following description are merely schematic representations of the shape, size, and positional relation to the extent that the content of the present invention can be understood. In other words, the present invention is not limited only to the shape, size, and positional relation illustrated in the figures.

EMBODIMENT

Figure 1:
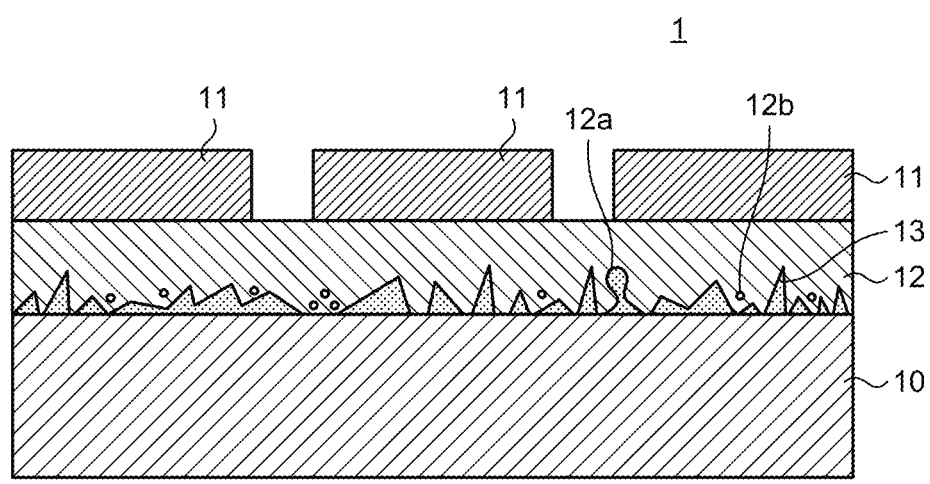
FIG. 1 is a sectional view illustrating a structure of a laminate according to an embodiment of the present invention.

FIG. 1 is a sectional view illustrating a structure of a laminate according to an embodiment of the present invention. A laminate 1 illustrated in FIG. 1 includes a base material 10, a plurality of circuits 11, an insulating layer 12 provided between the base material 10 and the circuits 11, and an adhesive 13 that bonds the base material 10 and the insulating layer 12.

The base material 10 is a substantially plate-shaped member. The base material 10 is illustrated in FIG. 1 as an example of a substantially plate shape, but is not limited to this shape. The base material 10 may be, for example, a heat sink with radiating fins. Materials for the base material 10 include, for example, aluminum, aluminum alloys having aluminum as the main ingredient, copper, and iron. The term "main ingredient" herein refers to an ingredient with the highest content by percentage among the ingredients constituting the material.

The insulating layer 12 is interposed between the base material 10 and the circuits 11 and transfers, to the base material 10, heat transferred from heating elements on the circuits to the circuits 11. The insulating layer 12 is formed using an insulating resin containing filler. The insulating resin is, for example, a thermosetting resin such as an epoxy resin. The filler has non-conductance and thermal conductivity, and its presence ratio is, for example, between or equal to 60% and 85% in volume ratio in the entire insulating layer 12. Aluminum oxide, silicon oxide, or boron nitride is used for the filler. The circuits 11 and the insulating layer 12 are bonded to each other by the adhesive strength of the resin component of the insulating layer. The volume ratio of the filler herein refers to the ratio of the volume of the filler to the sum of the volume of the resin and the volume of the filler.

In addition, a plurality of spaces (holes) made up of voids, cracks, or the like are formed in the interior of the insulating layer 12. These spaces include spaces leading to the surface of the insulating layer 12 and closed spaces in the interior of the insulating layer 12.

The adhesive 13 intervenes on a portion of the surface where the base material 10 and the insulating layer 12 face each other, to bond the base material 10 and the insulating layer 12. The base material 10 and the insulating layer 12 are bonded in part by the adhesive 13 and are in contact in other parts. The adhesive 13 enters and fills spaces 12a that lead to the surface of the insulating layer 12, of the spaces formed in the insulating layer 12, such as voids or cracked areas. In the present embodiment, the spaces 12a are spaces in the insulating layer 12 that lead to the surface facing the base material 10. The adhesive 13 fills the spaces 12a that can be permeated from the surface of the insulating layer 12, and does not fill closed spaces 12b that do not lead to the surface. For the adhesive 13, an insulating thermosetting resin is used. Thermosetting resins include, for example, epoxy resins. Epoxy resin curing agents include amine curing agents, phenol curing agents, acid anhydride curing agents, and imidazole curing agents. The same insulating resin as the insulating layer 12 may be used as the adhesive 13.

Figure 2:
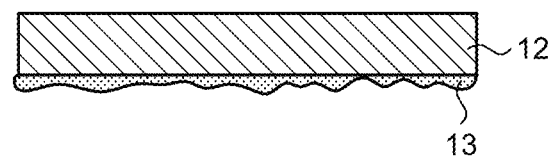
FIG. 2 is a sectional view (part 1) illustrating a method of manufacturing the laminate according to the embodiment of the present invention.
Figure 3:
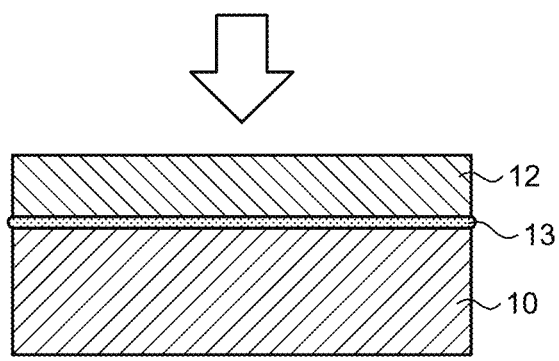
FIG. 3 is a sectional view (part 2) illustrating the method of manufacturing the laminate according to the embodiment of the present invention.

The adhesion between the base material 10 and the insulating layer 12 in the laminate will be described next with reference to FIG. 2 and FIG. 3. FIG. 2 and FIG. 3 are sectional views illustrating a method of manufacturing the laminate according to the embodiment of the present invention.

First, an insulating resin containing 70% filler by volume is molded and dried to create the insulating layer 12 having a thickness of 200 μm (see FIG. 2).

Then, the liquid adhesive 13 is applied to the surface of the insulating layer 12 to which the base material 10 is to be bonded. The amount of adhesive applied is to be less than the volume of the insulating layer that has been dried. At this time, part of the adhesive 13 permeates into the insulating layer 12. Even if the insulating layer 12 is hard before the adhesive 13 is applied, it becomes flexible and easy to handle after application. The insulating layer 12 permeated with the adhesive 13 constitutes an intermediate product for a circuit board.

The insulating layer 12 to which the liquid adhesive 13 has been applied is placed on the base material 10 having a thickness of 2 mm, and is heated and pressurized to cure the adhesive 13 (see FIG. 3). The temperature and pressure during curing are set as appropriate depending on the material used. For example, the treatment is performed at a pressure of from 15 MPa to 35 MPa inclusive for a few minutes at a high temperature of from 110° C. to 200° C. inclusive. At this time, the adhesive 13 enters voids or cracked areas formed in the insulating layer 12 by the pressurization (the spaces 12a mentioned above). The base material 10 and the insulating layer 12 are in contact in part. The insulating layer 12 is 120 μm thick after the pressurization.

The base material 10 and the insulating layer 12 are bonded by the adhesive 13 as described above. Thereafter, the circuits 11 having a thickness of 0.5 mm are bonded to the insulating layer 12, to produce the laminate 1. The circuits 11 and the insulating layer 12 are bonded by the adhesive strength of the resin component of the insulating layer 12.

As described above, according to the present embodiment, the base material 10 and the insulating layer 12 are bonded by the adhesive 13 in part while being in contact with each other in other parts. Thus, while the base material 10 and the insulating layer 12 are firmly bonded, the path of heat conduction from the circuits 11 to the base material 10 is also secured, which can satisfy the thermal conductivity and bonding strength. Furthermore, the adhesive 13 enters and fills the voids, cracked areas, and other spaces formed in the insulating layer 12, thereby improving the withstand voltage.

(First Modification)

Figure 4:
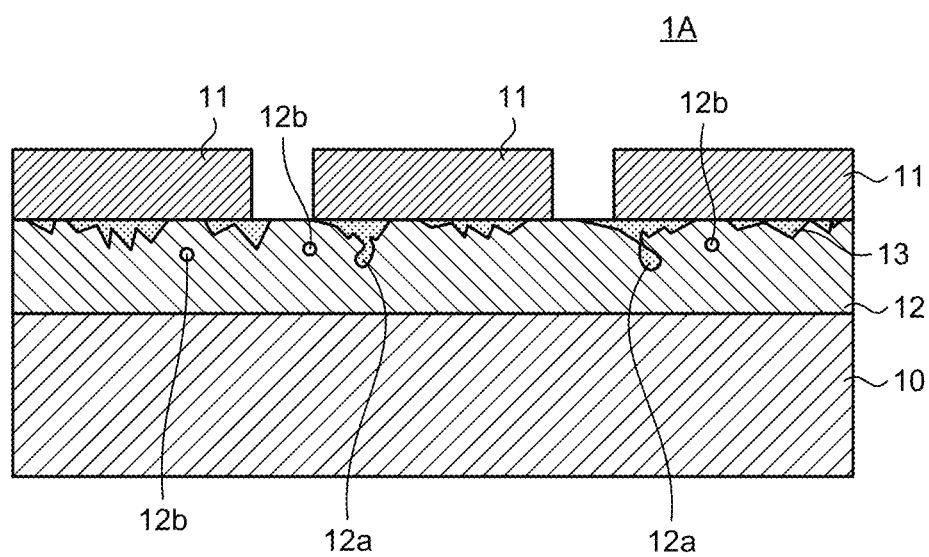
FIG. 4 is a sectional view illustrating a structure of a laminate according to a first modification of the present invention.

A first modification of the present invention will be described next with reference to FIG. 4. FIG. 4 is a sectional view illustrating a structure of a laminate according to the modification of the present invention. A laminate 1A according to the first modification uses a fast curing resin as the insulating layer 12. In the laminate 1A, a fast curing resin is used to enable adhesion between the base material 10 and the insulating layer 12. The laminate 1A differs from the laminate 1 according to the embodiment mentioned above in that the adhesive 13 bonds the circuits 11 and the insulating layer 12.

The laminate 1A according to the first modification includes the base material 10, the circuits 11, the insulating layer 12 provided between the base material 10 and the circuits 11, and the adhesive 13 that bonds the circuits 11 and the insulating layer 12. The adhesive 13 intervenes on a portion of the surface where the circuits 11 and the insulating layer 12 face each other, to bond the circuits 11 and the insulating layer 12. Similarly to the relation between the base material 10 and the insulating layer 12 in the laminate 1, the circuits 11 and the insulating layer 12 are bonded in part by the adhesive 13 and are in contact with each other in other parts. In the first modification, the base material 10 and the insulating layer 12 are bonded by the adhesive strength of the insulating resin and the adhesive.

According to the first modification, the circuits 11 and the insulating layer 12 are bonded by the adhesive 13 in part while being in contact with each other in other parts. Thus, while the circuits 11 and the insulating layer 12 are firmly bonded, the path of heat conduction from the circuits 11 to the insulating layer 12 is also secured, which can satisfy the thermal conductivity and bonding strength, similarly to the embodiment.

(Second Modification)

Figure 5:
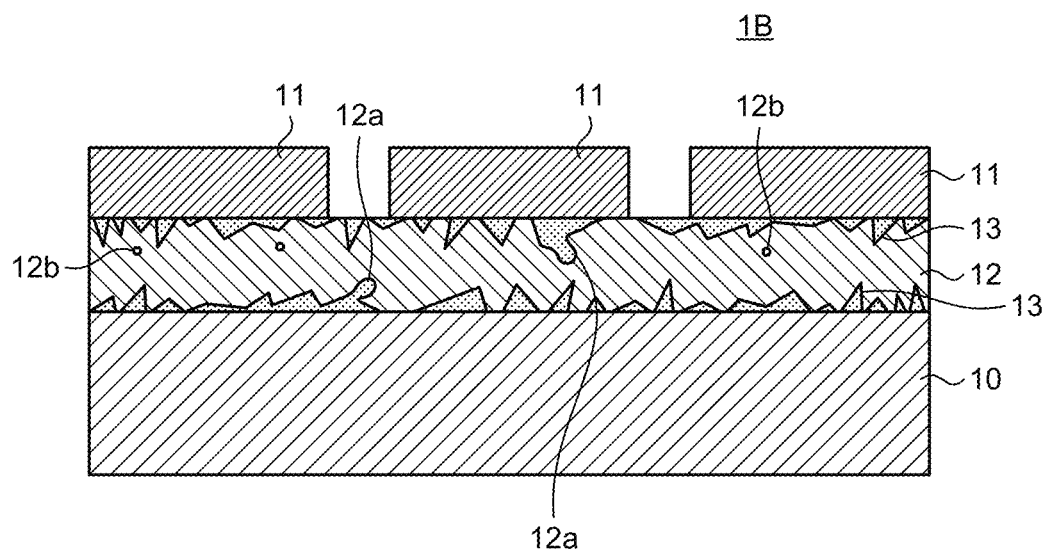
FIG. 5 is a sectional view illustrating a structure of a laminate according to a second modification of the present invention.

A second modification of the present invention will be described next with reference to FIG. 5. FIG. 5 is a sectional view illustrating a structure of a laminate according to the second modification of the present invention. The laminate 1B according to the second modification differs from the laminate 1 according to the embodiment mentioned above in that the adhesive 13 also bonds the circuits 11 and the insulating layer 12.

The laminate 1B according to the present modification includes the base material 10, the circuits 11, the insulating layer 12 provided between the base material 10 and the circuits 11, and the adhesive 13 that bonds the base material 10 and the insulating layer 12. The adhesive 13 intervenes on a portion of the surface where the base material 10 and the insulating layer 12 face each other, to bond the base material 10 and the insulating layer 12, and also intervenes on a portion of the surface where the circuits 11 and the insulating layer 12 face each other, to bond the circuits 11 and the insulating layer 12. Similarly to the relation between the base material 10 and the insulating layer 12, the circuits 11 and the insulating layer 12 are bonded by the adhesive 13 in part and in contact with each other in other parts.

Similarly to the embodiment, the adhesive 13 enters and fills the spaces 12a that lead to the surface of the insulating layer 12, of the spaces formed in the insulating layer 12, such as voids or cracked areas. In the present modification, the spaces 12a are spaces in the insulating layer 12 that lead to the surface facing the base material 10 or the surface on a side on which the circuits are laminated.

Figure 6:
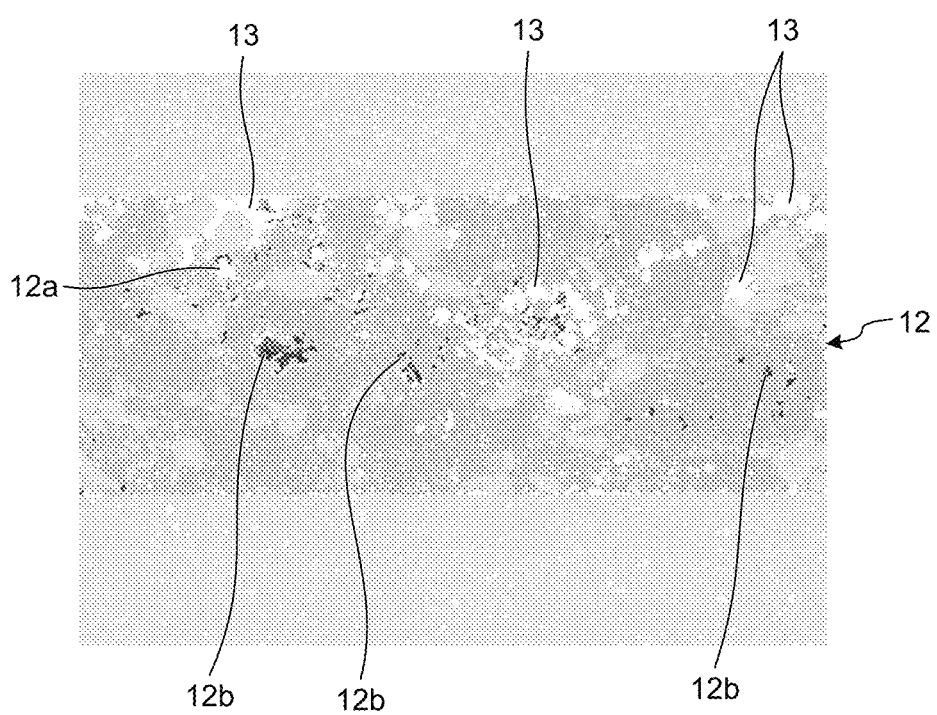
FIG. 6 is a view illustrating an image for observing a section of an insulating layer in the laminate according to the second modification of the present invention.

FIG. 6 is a view illustrating an image for observing a section of an area where the base material and the insulating layer are bonded in the laminate according to the second modification of the embodiment of the present invention. In FIG. 6, the same reference signs are given to the constituents corresponding to the laminate 1B illustrated in FIG. 5. FIG. 6 illustrates a SEM image of the section of the insulating layer in the laminate. In FIG. 6, it can be observed that the adhesive 13 enters and fills the spaces (spaces 12a), such as voids or cracked areas formed in the insulating layer 12. In FIG. 6, the adhesive 13 is represented in white. The reference signs illustrated in FIG. 6 are given to representative parts of each component.

Results of measuring characteristics of the various laminates will now be described.

In a sample of the laminate 1B, the thermal conductivity, withstand voltage, peel strength, which indicates the peel strength per unit area (width) to peel off the insulating layer 12 of the base material 10, for example, and void fraction were measured, and the thermal conductivity was 9 W/mK, withstand voltage was 6.4 kV, peel strength was 6.5 N/cm, and void fraction was 6.2. In contrast to this result, the same measurements were made on sample A, in which the base material 10 and the insulating layer 12, and the circuits 11 and the insulating layer 12 are both bonded through an adhesive layer in which the adhesive is provided in a continuous layer against the surface of the base material 10, and sample B, which has no adhesive 13. The sample A had a thermal conductivity of 8.1 W/mK, a withstand voltage of 4.7 kV, and a peel strength of 8.6 N/cm. The sample B had a thermal conductivity of 8.3 W/mK, a withstand voltage of 3.0 kV, and a void fraction of 7.1%. In contrast to the laminate 1B, the sample A had a higher peel strength but a lower thermal conductivity because the adhesive 13 is present in layers between the base material 10 and the insulating layer 12 and between the circuits 11 and the insulating layer 12. In addition, the adhesive 13 did not penetrate the spaces, such as voids or cracked areas, formed in the insulating layer 12, resulting in a lower withstand voltage. On the other hand, the sample B was not able to be measured for peel strength due to adhesion failure. This is considered to be because the adhesive strength of the resin in the insulating layer was insufficient for lamination due to the high filler content in the insulating layer. The measurement results show that the laminate 1B of the present invention secures all of the thermal conductivity, withstand voltage, and peel strength as compared with the conventional laminates.

Furthermore, as compared with the laminate 1B, a laminate (this is referred to as a laminate 1C) in which the filler contained by the insulating layer 12 was 75% by volume was produced, and the above characteristics were measured. In a case in which an imidazole curing agent is used as the adhesive for the laminate 1C, for example, 19.6% epoxy resin (main agent), 5.4% curing agent, and 75% filler by volume are mixed, made into a sheet, and dried to obtain the insulating layer 12 containing 19.9% of the polymerized component, 5.0% of the main agent, 0.1% of the curing agent, and 75% of the filler. Herein, the polymerized component includes reactants formed by the reaction of the main agents with each other or various combinations of the main agent with the curing agent, such as reactants formed by the reaction of the main agents with each other and reactants formed by the reaction of the main agent with the curing agent. Each reactant includes those of low molecular weight to high molecular weight.

The adhesive is then applied to permeate into the insulating layer 12. This results in an insulating layer 12 permeated with the adhesive, the insulating layer 12 containing 12.2% of the main agent, 18.3% of the polymerized component, and 69.5% of the filler. At this time, the permeability of the adhesive into the insulating layer 12 is 7.9% by volume relative to the entire insulating layer 12 that has been permeated with the adhesive. At this time, the porosity of the insulating layer 12 before being permeated with the adhesive was 39.9%, and the porosity of the insulating layer 12 after being permeated with the adhesive was 35.1%. This insulating layer 12 is used to produce the laminate 1C. The laminate 1C had a thermal conductivity of 10.9 W/mK and a withstand voltage of 8.0 kV. The laminate 1C has higher thermal conductivity and withstand voltage than the laminate 1B.

In a case in which an epoxy resin is used as the main agent and an amine curing agent as the curing agent for the adhesive of the laminate 1C, for example, 19.6% epoxy resin (main agent), 5.4% curing agent (amine) and 75% filler by volume are mixed, made into a sheet, and dried to obtain the insulating layer 12 containing 19.9% of the polymerized component, 5.0% of the main agent, 0.1% of the curing agent, and 75% of the filler. The adhesive is then applied to permeate into the insulating layer 12. This results in an insulating layer 12 permeated with the adhesive, the insulating layer 12 containing 8.5% of the main agent, 1.0% of the curing agent, 19.0% of the polymerized component, and 71.4% of the filler. At this time, the permeability of the adhesive into the insulating layer 12 is 5.0% by volume relative to the entire insulating layer 12 that has been permeated with the adhesive. The permeability of the adhesive varies with the viscosity of the adhesive. The permeability of the adhesive is equal to or greater than 2.0%.

As compared with the laminate 1B, a laminate (this is referred to as a laminate 1D) with the insulating layer 12 having a thickness of 100 μm was also produced, and the above characteristics were measured. The laminate 1D had a thermal conductivity of 9 W/mK, a withstand voltage of 5.3 kV, a peel strength of 6.5 N/cm, and a void fraction of 6.2. Both the laminates 1B and 1D have higher withstand voltages than the samples A and B.

Although the laminate 1D has the insulating layer 12 having a smaller thickness than that of the laminate 1B, the laminate 1D had the same thermal conductivity, peel strength, and void fraction as the laminate 1B. In particular, the laminate 1D excels in that the laminate 1D has a withstand voltage of equal to or greater than 5 kV despite its thinner insulating layer than that of the laminate 1B. Consequently, it can be said that the laminate 1D can reduce thermal resistance by about 17% while maintaining the characteristics of the laminate 1B.

Meanwhile, a sample C, which has no adhesive layer and the insulating layer of which is formed using a fast curing resin, a sample D, in which the filler contained in the insulating layer 12 is 75% by volume as compared with the sample B, and a sample E, in which the insulating layer 12 has a thickness of 100 μm as compared with the sample B, were produced. In each sample, adhesion failure occurred and the above measurements were not able to be made.

Thus, the present invention may include various embodiments and the like not described herein, and various design changes and the like may be made within the scope that does not depart from the technical idea specified by the scope of the claims. For example, the bonding method of the present invention may be applied to a structure in which, instead of the circuit of the present invention, a circuit board with a circuit pattern printed on resin is laminated on an insulating layer.

INDUSTRIAL APPLICABILITY

As described above, the laminate, the bonding method, and the intermediate product for a circuit board according to the present invention are suitable for obtaining a laminate capable of simultaneously satisfying withstand voltage, thermal conductivity, and bonding strength.

REFERENCE SIGNS LIST 1, 1A, 1B Laminates
10 Base material
11 Circuit
12 Insulating layer
13 Adhesive

The invention claimed is:
1. A laminate comprising:
a base material;
a circuit;
an insulating layer provided between the base material and the circuit, the insulating layer including a thermally conductive filler; and
an adhesive configured to bond at least the base material and the insulating layer, wherein
the base material and the insulating layer are bonded by the adhesive in part and in contact with each other in other parts,
the insulating layer includes a plurality of spaces formed therein, and
the adhesive fills at least a portion of the plurality of spaces.
2. The laminate according to claim 1, wherein
the adhesive is configured to bond the circuit and the insulating layer, and
the circuit and the insulating layer are bonded by the adhesive in part and in contact with each other in other parts.
3. The laminate according to claim 2, wherein the insulating layer includes 60% to 85% of the filler by volume.
4. A laminate comprising:
a base material;
a circuit;
an insulating layer provided between the base material and the circuit, the insulating layer including an insulating filler; and
an adhesive configured to bond at least the circuit and the insulating layer, wherein
the circuit and the insulating layer are bonded by the adhesive in part and in contact with each other in other parts,
the insulating layer includes a plurality of spaces formed therein, and
the adhesive fills at least a portion of the plurality of spaces that lead to a surface on a side of the circuit.
5. The laminate according to claim 1, wherein the insulating layer includes 60% to 85% of the filler by volume.
6. The laminate according to claim 4, wherein the insulating layer includes 60% to 85% of the filler by volume.
7. A bonding method for a laminate including: a base material; a circuit; an insulating layer provided between the base material and the circuit, the insulating layer including an insulating filler; and an adhesive configured to bond at least the base material and the insulating layer, the bonding method comprising:
permeating liquid adhesive into at least a portion of spaces formed in the insulating layer by applying the liquid adhesive to a bonding surface of the insulating layer to which the base material is bonded; and
stacking the bonding surface of the insulating layer and a bonding surface of the base material, and curing the liquid adhesive by pressurizing at a high temperature.

8. An intermediate product for a circuit board, comprising:
- an insulating layer; and
- an adhesive, wherein
- the insulating layer includes a plurality of spaces formed therein,
- the adhesive fills at least a portion of the plurality of spaces, and
- a part of a surface of the insulating layer where the plurality of spaces are not formed is exposed.

* * * * *